US007106062B1

United States Patent
Hardy et al.

(10) Patent No.: US 7,106,062 B1
(45) Date of Patent: Sep. 12, 2006

(54) METHOD AND SYSTEM FOR REDUCING COUPLING IN MAGNETIC RESONANCE RF COIL ARRAYS

(75) Inventors: Christopher Judson Hardy, Niskayuna, NY (US); Kenneth William Rohling, Niskayuna, NY (US); Jason Scott Pelc, Los Altos, CA (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/123,740

(22) Filed: May 6, 2005

(51) Int. Cl.
G01V 3/00 (2006.01)
(52) U.S. Cl. ........................... 324/318; 600/422
(58) Field of Classification Search ............... 324/318, 324/322; 600/422
See application file for complete search history.

(56) References Cited

U.S. PATENT DOCUMENTS

| | | | |
|---|---|---|---|
| 5,086,275 A * | 2/1992 | Roemer ............... | 324/309 |
| 5,594,339 A * | 1/1997 | Henderson et al. ...... | 324/318 |
| 6,680,610 B1 | 1/2004 | Kyriakos et al. ........ | 324/307 |
| 6,717,406 B1 | 4/2004 | Sodickson ............. | 324/307 |
| 6,876,199 B1 | 4/2005 | Hardy et al. .......... | 324/309 |
| 6,992,485 B1 * | 1/2006 | Campagna et al. ...... | 324/309 |

OTHER PUBLICATIONS

Pruessmann KP, et al, "SENSE: Sensitivity Encoding for Fast MRI", Magnetic Resonance in Medicine 42:952-962 (1999).
CJ Hardy, et al., "Large Field-of-View Real-Time MRI With a 32-Channel System", Magnetic Resonance in Medicine 52:878-884 (2004).
Fa-Hsuan Lin, "Regularization in Parallel Imaging Reconstruction", 2nd Int. Workshop on Parallel MRI, pp. 22-23, 2004.
Randy Duensing, "A 32 Element Cardiac Array", 2nd Int. Workshop on Parallel MRI, pp. 38, 2004.
P. Kellman, "Parallel Methods for Cardiac Imaging", 2nd Int. Workshop on Parallel MRI, pp. 82-83, 2004.

* cited by examiner

*Primary Examiner*—Luois M. Arana
(74) *Attorney, Agent, or Firm*—Fletcher Yoder

(57) ABSTRACT

A magnetic resonance imaging (MRI) device and a method of imaging a volume of interest is provided. According to one aspect of the present technique, the MRI device includes an attachment portion having a profile at least partially defined by a cross-section thereof, and an array of radio-frequency coils arranged with respect to each other to generally correspond to the profile. In an exemplary embodiment, each coil may have a first turn portion located radially closer to the attachment portion than a second turn portion.

25 Claims, 6 Drawing Sheets

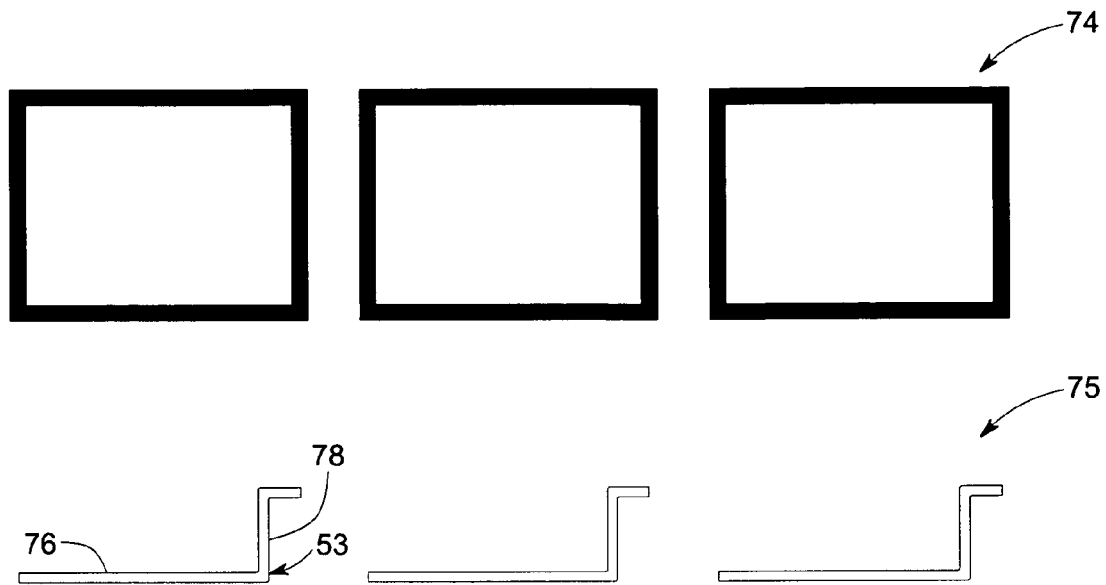
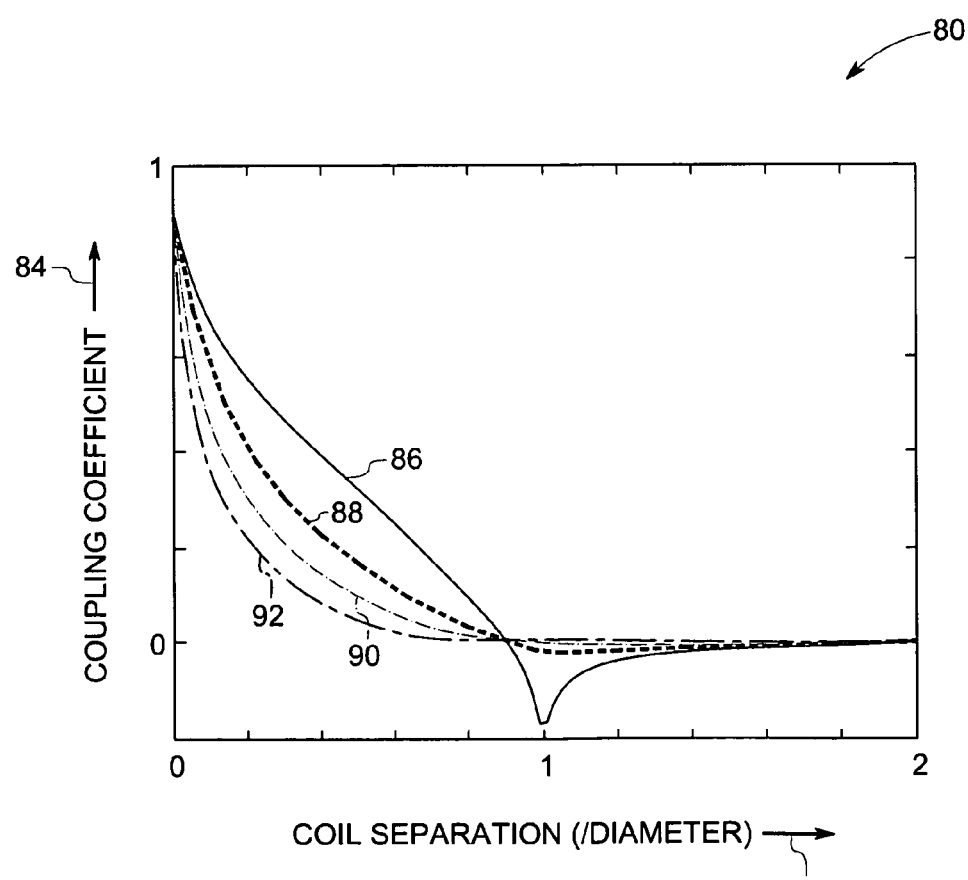
FIG.7
FIG.8

METHOD AND SYSTEM FOR REDUCING COUPLING IN MAGNETIC RESONANCE RF COIL ARRAYS

BACKGROUND

The present invention relates generally to the field of magnetic resonance imaging (MRI) and, in certain particular embodiments, to techniques for reducing coupling in an array of radio-frequency receiver coils and/or transmitter coils used in parallel MRI devices, for instance.

MRI is a non-invasive imaging technique in which the imaged subject is placed in a static main magnetic field known as the "B0" field. While in the B0 field, gradient coils are excited to create the "B1" field, in turn, exciting the nuclei of the imaged subject. In certain MRI systems, a plurality of radio-frequency coils are needed to transmit the RF energy to the nuclear magnetic moments as well as to receive the extremely small signal that comes back from the subject. The signals, referred to as magnetic resonance signals, result from reorientation of certain gyromagnetic materials of the subject, whose molecules spin or precess at characteristic frequencies. The radio-frequency coils are commonly employed to image whole body, head and limb imaging in medical applications. Moreover, MRI devices often include an array of receiver coils to improve the performance of the MRI devices. Irrespective of the specific implementation, MRI techniques are also used outside of the medical imaging field, such as in part inspection, baggage inspection, and so forth.

In recent years, parallel MRI imaging has emerged as an attractive imaging modality that results in scan time reduction, resolution enhancement, artifact suppression, and, even, attenuation of noise. In a general sense, parallel imaging utilizes the difference in sensitivities between individual coils of a receiver array to reduce the number of gradient encoding steps required for imaging. Thus, in parallel MRI, an array of receiver coils with different sensitivities is used to receive the signal in parallel, facilitating combination of these obtained signals to reconstruct the full image.

There are several parallel MRI approaches, including SMASH (SiMultaneous Acquisition of Spatial Harmonics) and SENSE (SENSitivity Encoding). For pulse sequences that execute a rectilinear trajectory in k space, these techniques reduce the number of phase encoding steps in order to reduce imaging time, and then use array sensitivity information to make up for the loss of spatial information.

In order to make the coils in the array sufficiently spatially distinct, and thus improve their signal-to-noise ratio (SNR) for accelerated imaging, it is common to leave gaps between neighboring coils in the array. This, however, has the drawback of increasing the coupling between coils, which can in turn degrade performance. To overcome this limitation, the coils in the array may be overlapped by an amount that minimizes the mutual inductance between neighboring coils. When such an array is employed for parallel imaging, the SNR decreases, because the geometry factor of the array has increased. The geometry factor quantifies the spatial distribution of the noise amplification. The optimization of array geometry is necessary to minimize the geometry factors in MRI.

It would therefore be desirable to have a technique to reduce the coupling between coils in parallel imaging arrays without compromising the SNR.

BRIEF DESCRIPTION

Briefly, in accordance with one aspect of the present technique, a magnetic resonance imaging (MRI) device for imaging a volume of interest is provided. The MRI device includes an attachment portion having a profile at least partially defined by a cross-section thereof, and an array of radio-frequency receiver coils arranged with respect to each other to generally correspond to the profile. In an exemplary embodiment, each coil may have a first turn portion located radially closer to the attachment portion than a second turn portion.

In accordance with another aspect, a method for reducing coupling in magnetic resonance imaging (MRI) is provided. The method includes a step of providing an attachment portion having a profile at least partially defined by a cross-section thereof. An array of radio-frequency transmitter coils is provided for producing controlled radio-frequency field applying excitation signals to a volume of interest. According to aspects of the present technique, the method further includes arranging the radio-frequency transmitter coils with respect to each other to generally correspond to the profile, each coil having a first turn portion located radially closer to the attachment portion than a second turn portion.

DRAWINGS

These and other features, aspects, and advantages of the present invention will become better understood when the following detailed description is read with reference to the accompanying drawings in which like characters represent like parts throughout the drawings, wherein:

FIG. 7 is a diagrammatic representation of another exemplary embodiment including the array of radio-frequency coils arranged with respect to each other to correspond to the profile, where at least one coil has a side raised with respect to the attachment portion;

FIG. 8 is a graphical representation illustrating the coupling for flat and tilted coils, as a function of coil separation.

DETAILED DESCRIPTION

According to aspects of the present technique, systems and methods for reducing the coupling between radio-frequency coils of a parallel MRI array, while improving signal-to-noise ratios (SNR) are provided. Such exemplary embodiments, as discussed further below, are effectuated by slightly tilting each coil in the array, for example, to lower the mutual inductance.

Figure 1:
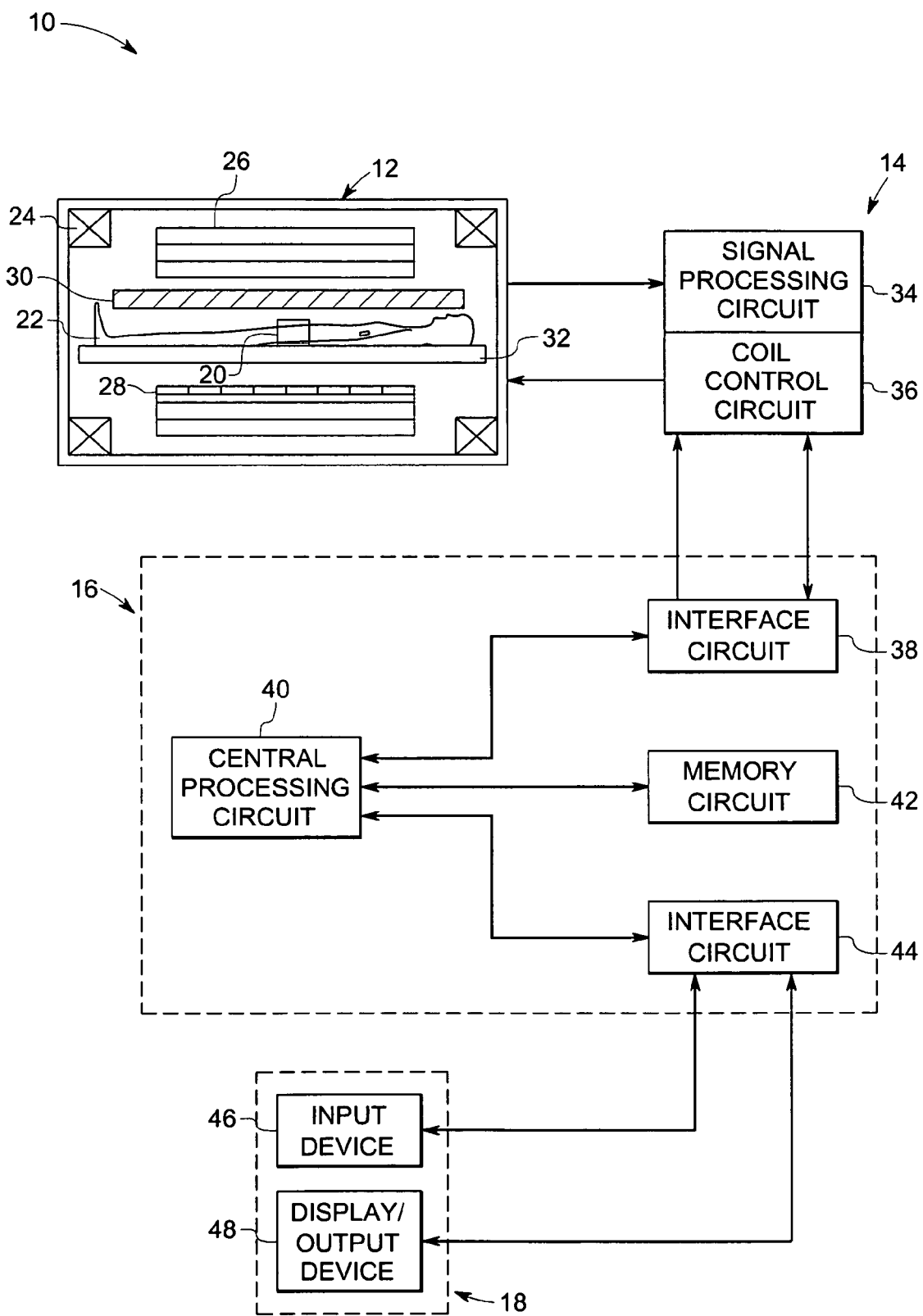
FIG. 1 is a diagrammatic representation of an exemplary MRI system suitable for use with the present techniques.

Referring to FIG. 1, a magnetic resonance system, designated generally by the reference numeral 10, is illustrated. This system includes a magnet assembly 12, control and acquisition circuit 14, system controller circuit 16, and an operator interface station 18. The magnet assembly 12, in turn, includes gradient coil assemblies for selectively generating controlled magnetic fields used to excite gyromagnetic materials spin systems in a volume of interest 20 of a patient 22. In particular, the magnet assembly 12 includes a primary coil 24, which will typically include a super conducting magnet coupled to a cryogenic refrigeration system (not shown). The primary coil 24 generates a highly uniform B0 magnetic field along a longitudinal axis of the magnet assembly. A gradient coil assembly 26 consisting of a series of gradient coils is also provided for generating controllable gradient magnetic fields having desired orientations with respect to the subject of interest. In particular, as will be appreciated by those skilled in the art, the gradient coil assembly produces fields in response to pulsed signals for selecting an image slice, orienting the image slice, and encoding excited gyromagnetic material spin systems within the slice to produce the desired image. An RF transmit coil 28 is provided to generate excitation signals that result in MR emissions from the subject, and these excitation signals are influenced by the gradient fields and collected by a receive coil array 30 for analysis, as described below.

A table 32 is positioned within the magnet assembly 12 to support a subject 22. While a full body MRI system is illustrated in the exemplary embodiment of FIG. 1, the technique described below may be equally well applied to various alternative configurations of systems and scanners, including smaller scanners and probes used in MR applications for security and well as medical purposes, for example.

In the embodiment illustrated in FIG. 1, the control and acquisition circuit 14 includes coil control circuit 34 and signal processing circuit 36. The coil control circuit 34 receives pulse sequence descriptions from the system controller 16, notably through the interface circuit 38 included in the system controller 16. As will be appreciated by those skilled in the art, such pulse sequence descriptions generally include digitized data defining pulses for exciting the coils of the gradient coil assembly 26 during excitation and data acquisition phases of operation. Fields generated by the transmit coil assembly 28 excite the spin system within the subject 22 to cause emissions from the material. Such emissions are detected by a receive coil array 30 and are filtered, amplified, and transmitted to signal processing circuit 36. Signal processing circuit 36 may perform preliminary processing of the detected signals, such as amplification of the signals. Following such processing, the amplified signals are transmitted to the interface circuit 38 for further processing. In the present technique the receive coil array 30 includes radio-frequency coils that arranged with respect to each other to correspond to a profile, where each receiver coil is tilted with respect to the profile. The profile, referred to herein includes but is not limited to the various anatomic contours such as head, torso, knee, shoulder, ankle, and wrist. The specific configurations of receive coil array are described below in more detail. It should be noted that the receive coil array 30 may also be used, where desired, in a transmit mode to create the resulting MR signals, thereby replacing, at least in certain applications, the need for a separate transmit coil assembly.

In addition to the interface circuit 38, the system controller 16 includes central processing circuit 40, memory circuit 42, and interface circuit 44 for communicating with the operator interface station 18. In general, the central processing circuit 40, which will typically include a digital signal processor, a CPU or the like, as well as associated signal processing circuit, commands excitation and data acquisition pulse sequences for the magnet assembly 12 and the control and acquisition circuit 14 through the intermediary of the interface circuit 38. The central processing circuit 38 also processes image data received via the interface circuit 38, to perform 2D Fourier transforms to convert the acquired data from the time domain to the frequency domain, and to reconstruct the data into a meaningful image. The memory circuit 42 serves to save such data, as well as pulse sequence descriptions, configuration parameters, and so forth. The interface circuit 44 permits the system controller 16 to receive and transmit configuration parameters, image protocol and command instructions, and so forth.

The operator interface station 18 includes one or more input devices 46, along with one or more display or output devices 48. In a typical application, the input device 46 will include a conventional operator keyboard, or other operator input devices for selecting image types, image slice orientations, configuration parameters, and so forth. The display/output device 48 will typically include a computer monitor for displaying the operator selections, as well as for viewing scanned and reconstructed images. Such devices may also include printers or other peripherals for reproducing hard copies of the reconstructed images.

Figure 2:
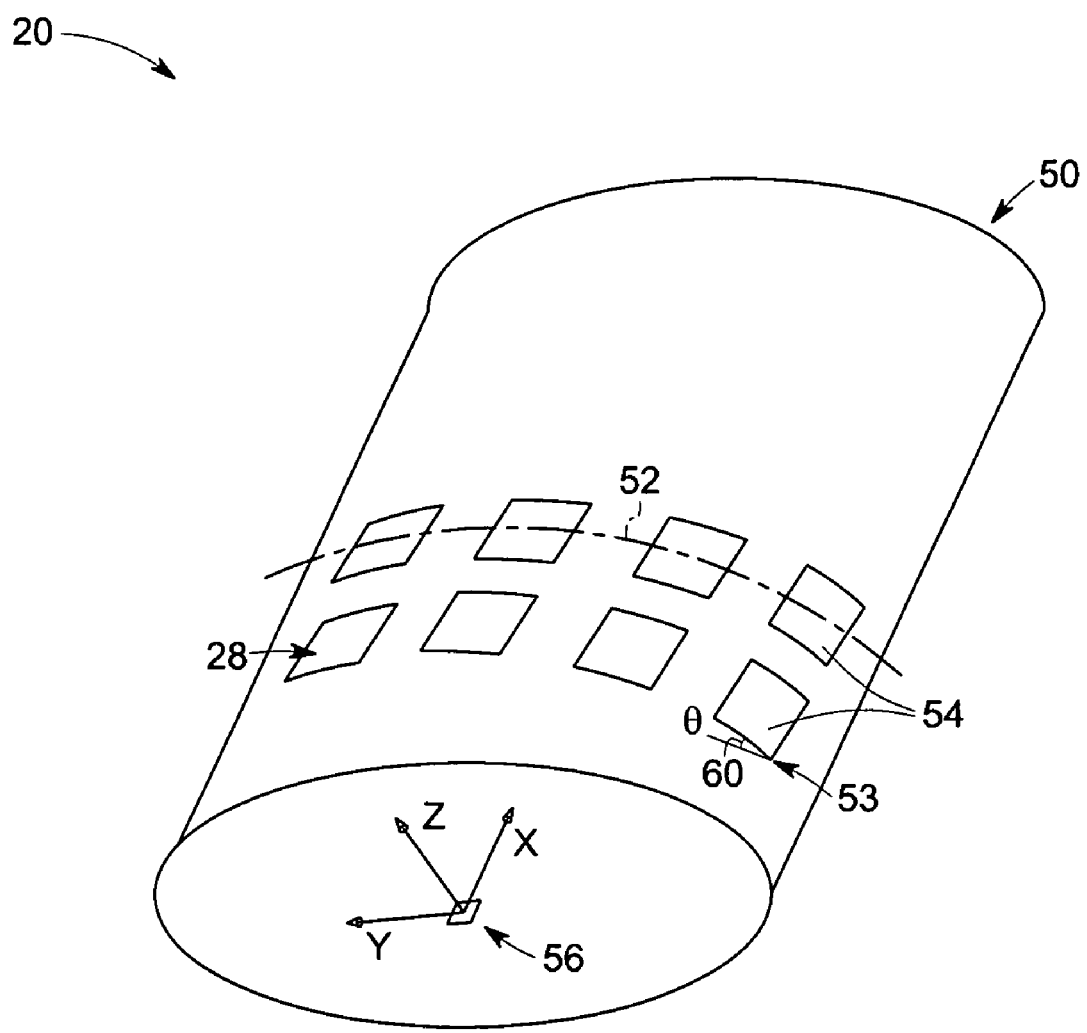
FIG. 2 is a diagrammatic representation of an array of radio-frequency coils arranged about an attachment portion.

FIG. 2 illustrates an array of coils 54, which may be used as receive coils or receive and/or transmit coils. The coils in receive mode may have different sensitivities to acquire magnetic resonance signals from the volume of interest 20. Further the volume of interest may be captured by having different shaped arrays, tailored for different anatomic contours, e.g. for head, for torso, for shoulder, for knee, for wrist etc. According to one aspect of the present technique, the array of radio-frequency coils 54 may be arranged with respect to each other to correspond to the selected profile, where each receiver coil may be tilted or arranged at an offset or askewed with respect to the profile. This may be achieved by using an attachment portion 53 having a profile at least partially defined by a cross-section 52. The profile as used herein corresponds generally to the anatomic contours being imaged. Reference numeral 56 indicates the x, y, and z directions with respect to the magnetic resonance imaging system. "Tilt" may be generally defined as positioning the coils at either an angle, at an inclination, at a slant or at a bias. "Offset" may generally be defined as an abrupt bend in an object by which one part is turned aside out of line. "Askew" as used herein, generally means out of line, or in a turned or twisted position or direction. Tilting the coils or arranging them at an offset or at askew with respect to the selected profile causes flux from one coil to link its neighbor from both sides of the coil, causing flux cancellation and a reduction in mutual inductance or coupling between the coils. Thus coupling between the coils is reduced without compromising the SNR. Several different configurations may be employed to reduce the coupling according to aspects of the present technique and are described in more details in reference with FIGS. 3–7.

Figure 3:
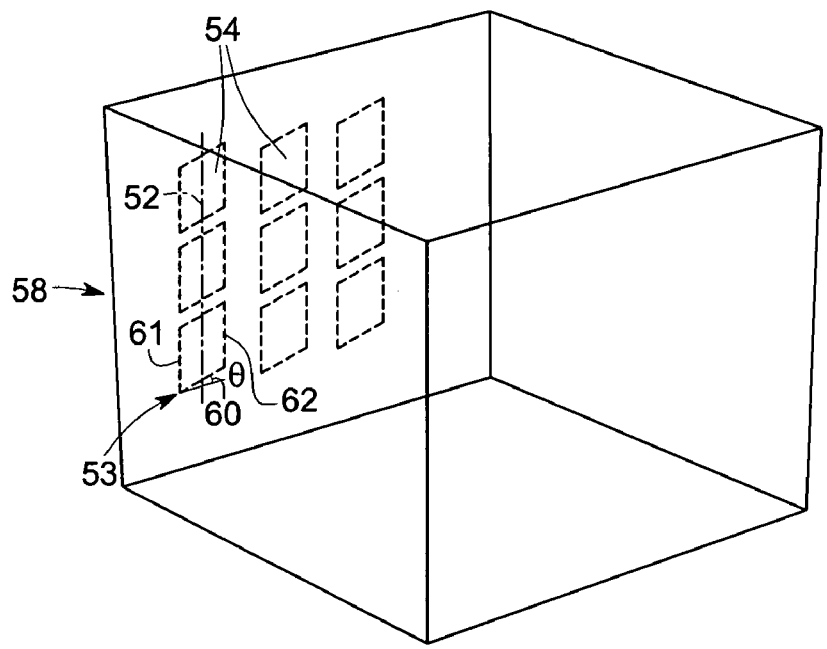
FIG. 3 is a diagrammatic representation of an exemplary embodiment including the array of radio-frequency coils arranged with respect to each other to correspond to the profile, where each coil is tilted in the right-left direction, with respect to the profile.

As mentioned earlier, geometry factor or g factor quantifies the spatial distribution of the noise amplification, and the optimization of array geometry is necessary to minimize the geometry factors in MRI. Also, SNR in parallel imaging ($SNR_{accel}$) may generally be expressed as follows:

$$SNR_{accel} = SNR_{unaccel}/(\sqrt{Ag}), \quad [1]$$

where $SNR_{unaccel}$ is the SNR of the unaccelerated image, A is the acceleration factor, and g is the geometry factor for the array. In one embodiment, in order to reduce the coupling between neighboring coils while maintaining low geometry factors (g factors), each coil 54 in the array may be tilted at an angle θ, also indicated by reference numeral 60, as shown in FIG. 3. In this exemplary embodiment, the coils may be arranged with respect to each other to generally correspond to the profile 50, where each coil may have a first turn portion 61 located radially closer to the attachment portion 53 than a second turn portion 62. As mentioned earlier the attachment portion may have a profile at least partially defined by the cross-section 52. The array may be used for imaging a cubical volume of interest 58. It may be noted that the cubical volume 58 is shown by way of example and other geometric profiles are equally available. The coils illustrated in FIG. 3 may also be underlapped, and one side of each coil, for example the right side as indicated by reference numeral 62 may be tilted back, away from the patient by an amount (y) given in equation [1] below:

$$y = x * \tan(\theta), \quad [1]$$

where x is the right-left distance from the attachment portion 53, in one example. In one such exemplary embodiment, the coupling coefficient between right-left nearest neighbors was observed to be less than 0.001, but the accelerated SNR was essentially the same as a non-tilted coil.

Figure 4:
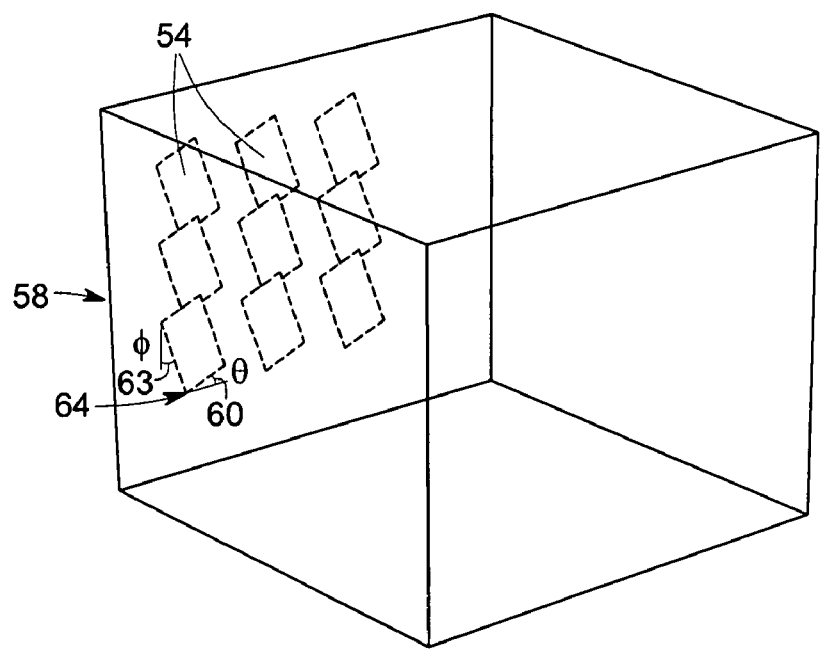
FIG. 4 is a diagrammatic representation of another exemplary embodiment including the array of radio-frequency coils arranged with respect to each other to correspond to the profile, where each coil is tilted in top-bottom and right-left direction with respect to the profile.

In another embodiment as shown in FIG. 4, a corner 64 of each coil may be tilted back by an angle θ (indicated by reference numeral 60) in the x direction and an angle φ (indicated by reference numeral 63) in the z direction, away from the patient, in order to reduce coupling between neighboring coils in the S/I (z) direction as well as neighboring coils in the right/left (x) direction. The array in this example, may include underlapped coils, with each coil tilted in the top-bottom and right-left directions. The tilt may be defined by an amount as shown in equation [2] below:

$$y = x * \tan(\theta) + z * \tan(\phi) \quad [2]$$

Here the magnitude of the coupling coefficient between nearest-neighbor coils was reduced to less than 0.002, in both the x and the z directions.

Figure 5:
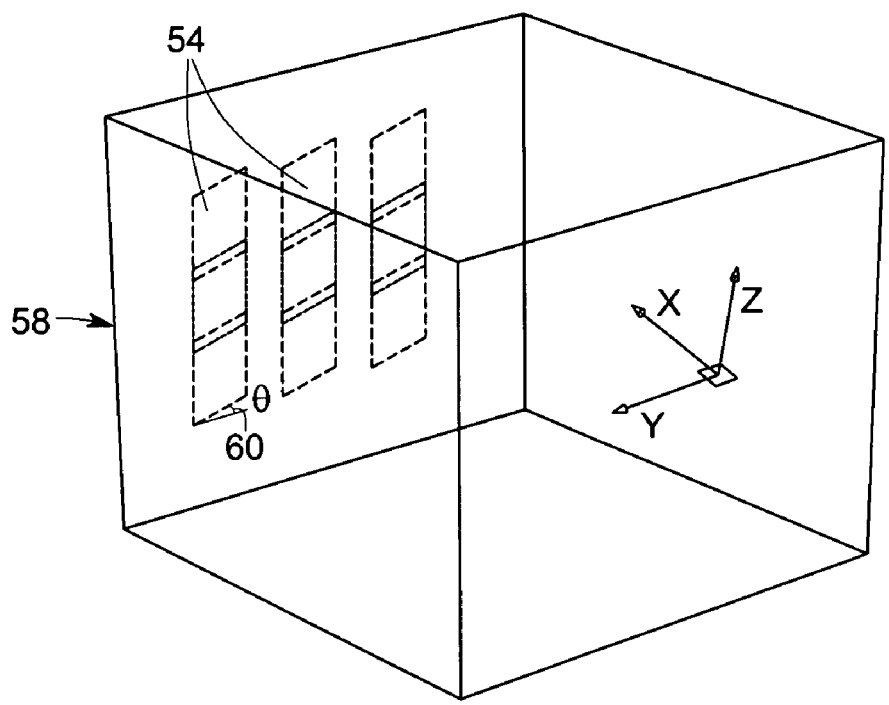
FIG. 5 is a diagrammatic representation of another exemplary embodiment including the array of radio-frequency coils arranged with respect to each other to correspond to the profile, where the coils are overlapped in z direction and underlapped in x direction, and each coil is tilted in right-left direction with respect to the profile.

In another embodiment as shown in FIG. 5, the coils may be overlapped in the z direction (to get zero mutual inductance between z neighbors) and tilted in the x direction (for zero mutual inductance between x neighbors). The z and x directions are defined with respect to the MRI device, and the z direction corresponds to the direction of a static magnetic field of the MRI device. It may be noted by those skilled in the art, that overlapping the coils in z direction does not degrade the g factor significantly because there are valleys in the sensitivity map of each coil just above and below the coil in the z direction, producing more distinct sensitivity profiles between neighboring coils. This is because the main static magnetic field points in the z direction, and only the x and y components of the RF magnetic field contribute to the coil sensitivity. In one example, a "radius" of 4 cm in the x direction and 5 cm in the z direction was chosen, and the tilt was calculated based on equation [1]. The magnitude of the coupling coefficient was observed to be around 0.001 between neighboring coils in both the x and z directions. The mean geometry factor is predicted to be around 10% lower than that of a similar overlapped array, based on computer simulations.

It may be noted, that any residual coupling in the above examples may come only from insufficient tuning, and minor adjustments of tilts and overlaps allow the coupling coefficient to be arbitrarily close to zero. Other variations may be possible, including staggering the rows or columns. The tilting of coils as described in aforementioned embodiments, is further advantageous as it improves i.e. reduces the average conditioning number for the array, producing lower residual aliasing artifact in the reconstructed image.

Figure 6:
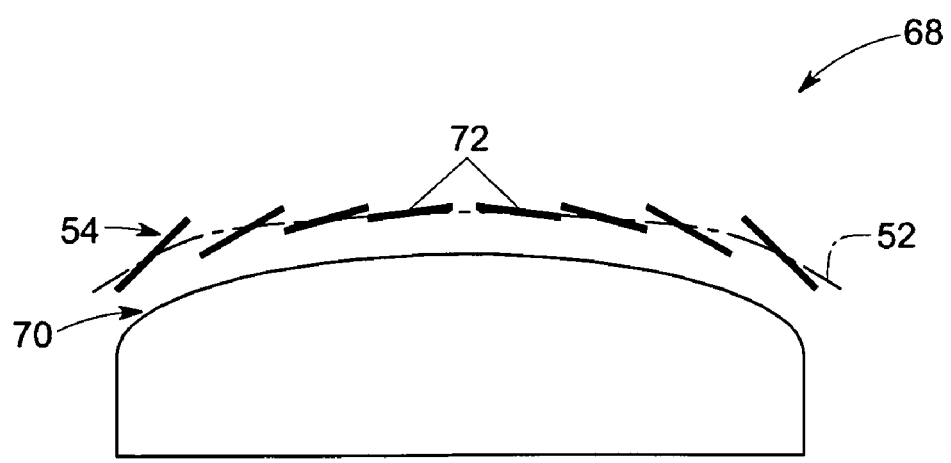
FIG. 6 is a diagrammatic representation of another exemplary embodiment including the array of radio-frequency coils arranged with respect to each other to correspond to the profile, where coils are tilted by varying amounts.

In another exemplary embodiment as shown in FIG. 6, the anatomic contour to be imaged may be a torso. For such a profile (shown by cross-section or centerline 52), the coils 54 of the array may be mounted on a curved surface 70 such that the adjacent coils are askew with respect to one another, as shown in an exemplary embodiment 68. The coils may be generally planar coils in one exemplary embodiment. The zero-coupling condition between nearest neighboring coils may be maintained, in one exemplary embodiment, by progressively tilting each coil to a higher angle, as shown schematically in FIG. 6. Since the surface is curving, each of the tilted coils may have a relatively lesser tilt relative to the surface directly under them. The two center coils 72, in such a configuration, may in general have a net mutual inductance, but these can be decoupled by conventional means, such as transformers or capacitor networks. In one example, the coils may be overlapped in the S/I direction (into the page, in FIG. 6).

FIG. 7 shows a top view 74 and a side view 75 of another exemplary embodiment, where each coil (76, 78) may arranged at an offset, e.g. in a stepped configuration. Such an arrangement may be achieved by disposing one of the sides 78 of the coil at a height, for example, by raising it up off the attachment portion 53. Any desired cross-section may be achieved, for example a Z-shaped (such as side view 75) or an L-shaped configuration. In this configuration, nearest neighboring coils may have zero mutual inductance, given a correct step height. Computer modeling has shown that the accelerated SNR for this configuration is similar to the tilted embodiments.

The results of using the configurations described herein above were tested via simulations and experiments. Simulations were performed using MATLAB (MathWorks, Natick, Mass.) for linear arrays of five coils laid out in an A/P plane, with coils running along the L/R direction. The field strength was assumed to be 1.5 T (dielectric effects were ignored). Vector potentials and magnetic fields were calculated for each coil of the array and used to calculate baseline SNR, mutual inductance, noise-resistance matrix, g factor, conditioning, and accelerated SNR over coronal planes at various depths. These simulations were applied to a number of different arrays, all of which had the same overall spatial extent. These arrays included one with nearest neighbors overlapped to give zero mutual inductance, one underlapped by an amount which maximized the accelerated (×4) SNR at a depth of one coil diameter, and one similar to the previous one, but with each coil tilted on its right edge (like a Venetian blind) by an amount which zeroed the mutual inductance between nearest neighbors. Subsequently, an array of five 8-cm square coils was assembled to test predictions of the simulations. A rectangular CuSO4 salt-loading phantom was constructed which loaded the coils by the same amount as a typical human torso. The coils were arrayed in the L/R direction on the phantom, and gradient-echo images were acquired from a number of axial and coronal planes. 16 images were acquired from each location, and SNR at each pixel was calculated by taking the average and standard deviation of image intensity across images. Measurements were made for overlapped coils and for underlapped coils tilted in the L/R direction by an amount that nulled the mutual inductance between nearest neighbors. For tilted coils the input capacitors were retuned to match the loaded impedance to 50Ω.

FIG. 8 shows the results of simulations in a graphical representation 80. The graph shows the coupling coefficients for flat and tilted coils on the Y axis, denoted generally by reference numeral 84, as function of coil separation (relative to flat coil diameter), shown on the X axis and denoted generally by reference numeral 82. It was observed that the overlapped coils, (curve indicated by reference numeral 86) had no coupling at a separation of ~0.9 diameters, whereas the tilted coils (curves indicated by reference numerals 88, 90, 92, having increasing tilt angles respectively) were decoupled over a much wider range of coil spacing. The average g factor observed for overlapped coils was 1.76 and 1.73 for tilted coils. Both average baseline SNR and 4-fold accelerated SNR were within 3% of one another for the two arrays. At a depth of two coil diameters the accelerated SNR of the tilted array was identical to that of the overlapped array. Average measured SNR for 4-fold accelerated images from the phantom experiments showed the tilted array within 7% of the overlapped array at a depth of one coil diameter, and slightly better than the overlapped array at a depth of two diameters. Also experiments verified that a wider no-coupling zone is available for tilted arrays as predicted by simulations and shown in FIG. 8. The tilted arrays also showed little effect as new coils were added to the array. Thus the simulations and experiments verified that tilted coil arrays provide reduced coupling without compromising SNR.

Figure 9:
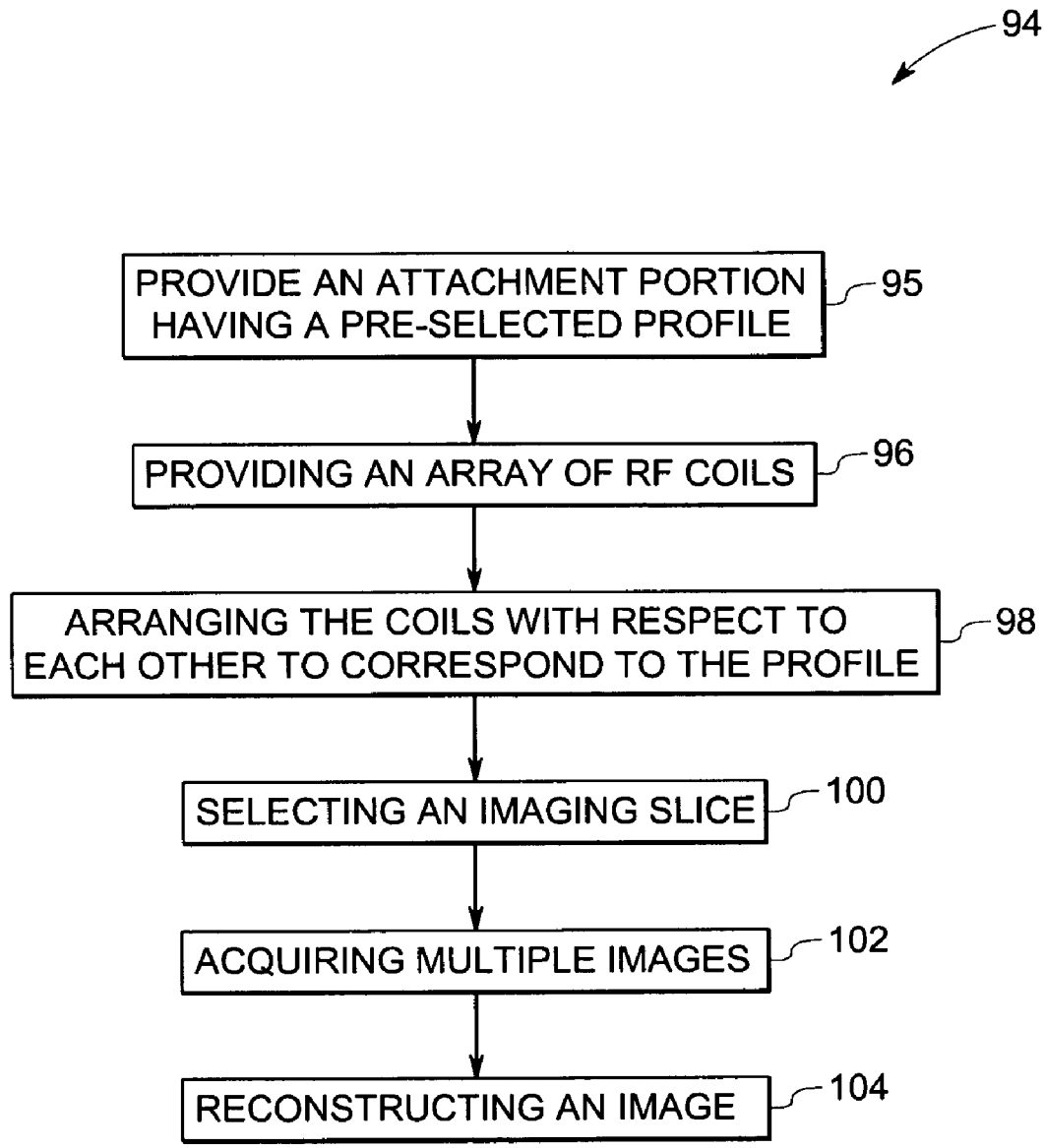
FIG. 9 is a flowchart showing exemplary steps for a method of MR imaging according to aspects of the present techniques.

FIG. 9 is a flowchart illustrating exemplary steps for a method of MRI using the different coil configurations as described herein. At step 95, an attachment portion is provided having a profile at least partially defined by a cross-section thereof. At step 96 an array of radio-frequency coils may be provided. At step 98 the radio-frequency coils may be arranged with respect to each other to generally correspond to the profile, each coil having a first turn portion located radially closer to the attachment portion than a second turn portion. At step 100, an imaging slice may be selected for the volume of interest. At step 102, multiple images may be acquired using the different coil configurations in receive and/or transmit mode. Finally, at step 104 the image may be reconstructed for diagnosis.

The various aspects of the present technique described herein above provide several advantages over the traditional overlapped arrays. While maintaining similar or improved SNR, the tilted arrays are advantageous because of the relative ease of construction arising from the essential independence of each coil in the array. The aspects of the present technique may be especially useful for dense 2D arrays, where aggregate coupling from non-nearest neighbors can be substantial.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A magnetic resonance imaging (MRI) device for imaging a volume of interest, the MRI device comprising:
an array of radio-frequency coils coupled to an attachment portion, wherein the attachment portion has a profile at least partially defined by a cross-section thereof, and wherein the coils in the array are arranged with respect to each other to generally correspond to the profile, each coil having a first turn portion located radially closer to the attachment portion than a second turn portion.

2. The MRI device of claim 1, wherein the array of radio-frequency coils comprises receiver coils or transmitter coils or combined transmitter-receiver coils or any combination thereof.

3. The MRI device of claim 1, wherein adjacent coils in the array of radio-frequency coils are askew with respect to one another.

4. The MRI device of claim 1, where the array of radio-frequency coils comprises coils operable to receive and transmit magnetic resonance signals.

5. The MRI device of claim 1, wherein each radio-frequency coil is generally planar and askew with respect to the attachment portion.

6. The MRI device of claim 1, comprising a radio-frequency coil having a side disposed at a height with respect to the attachment portion.

7. The MRI device of claim 1, wherein the array of radio-frequency coils is a two-dimensional array, and wherein the coils are overlapped in one dimension and tilted in the other dimension.

8. A magnetic resonance imaging (MRI) system for imaging a volume of interest, the MRI system comprising:
an array of radio-frequency coils coupled to an attachment portion, wherein a centerline of each radio-frequency coil is askew with respect to the attachment portion, and wherein the attachment portion is configured to at least partially surround the volume of interest.

9. The MRI system of claim 8, wherein the array of radio-frequency coils comprises receiver coils.

10. The MRI system of claim 8, wherein the array of radio-frequency coils comprises transmitter coils.

11. The MRI system of claim 8, wherein the array of radio-frequency coils comprises coils configured to receive and transmit magnetic resonance signals.

12. The MRI system of claim 8, wherein adjacent radio-frequency coils are askew with respect to one another.

13. The MRI system of claim 8, wherein array of radio-frequency coils is a two-dimensional array, and wherein the receiver coils are overlapped in one dimension and angularly disposed in the other dimension.

14. A magnetic resonance imaging (MRI) system for imaging a volume of interest, the MRI system comprising:
an array of radio-frequency transmitter coils coupled to an attachment portion, wherein the attachment portion has a profile generally defined by a cross-section thereof, and wherein the coils are arranged with respect to each other to correspond generally to the profile, each transmitter coil has a first turn portion located radially closer to the attachment portion than a second turn portion;

at least one receiver coil for receiving magnetic resonance signals resulting from the excitation from the transmitter coils; and a coil control circuitry configured to energize the array of radio-frequency transmitter coils and to obtain an image from the magnetic resonance signals received by the at least one receiver coil.

15. The MRI system of claim 14, wherein the each radio-frequency coil is generally planar.

16. The MRI system of claim 14, wherein each radio-frequency coil has a Z-shaped cross-section.

17. The MRI system of claim 14, wherein each radio-frequency coil is askew with respect to the attachment portion.

18. The MRI system of claim 14, wherein adjacent radio frequency coils are askew with respect to one another.

19. A method for reducing coupling in magnetic resonance imaging (MRI), the method comprising:

providing an attachment portion having a profile at least partially defined by a cross-section thereof;

providing an array of radio-frequency coils for producing controlled radio-frequency field applying excitation signals to a volume of interest; and arranging the radio-frequency coils with respect to each other to generally correspond to the profile, each coil having a first turn portion located radially closer to the attachment portion than a second turn portion.

20. The method of claim 19, further comprising arranging adjacent coils such that the adjacent coils are askew with respect to one another.

21. The method of claim 19, further comprising, operating the coils to receive and transmit magnetic resonance signals.

22. The method of claim 19, wherein each radio-frequency coil is generally planar and askew with respect to the attachment portion.

23. The method of claim 19, comprising a radio-frequency coil having a Z-shaped cross-section.

24. The method of claim 19, wherein the array of radio-frequency coils is two dimensional, and wherein the coils are overlapped in one dimension and tilted in the other dimension.

25. A method for magnetic resonance imaging, the method comprising:

providing an attachment portion having a profile at least partially defined by a cross-section thereof;

providing an array of radio-frequency transmitter coils for producing controlled radio-frequency field applying excitation signals to a volume of interest;

arranging the radio-frequency transmitter coils with respect to each other to generally correspond to the profile, each coil having a first turn portion located radially closer to the attachment portion than a second turn portion;

selecting an imaging slice within the volume of interest being imaged;

acquiring a plurality of images at the selected image slice after exciting the transmitter coils in the array; and reconstructing the plurality of images into a reconstructed image.

* * * * *